United States Patent [19]

Klement

[11] 4,371,850
[45] Feb. 1, 1983

[54] HIGH ACCURACY DELTA MODULATOR

[75] Inventor: Stefan H. Klement, White Plains, N.Y.

[73] Assignee: Honeywell Inc., Minneapolis, Minn.

[21] Appl. No.: 216,028

[22] Filed: Dec. 12, 1980

[51] Int. Cl.³ .............................................. H03K 13/22
[52] U.S. Cl. ................................ 332/11 D; 375/26; 375/28
[58] Field of Search ................ 332/11 D; 375/26, 28, 375/29, 33

[56] References Cited

U.S. PATENT DOCUMENTS 3,867,650 2/1975 Baldwin ...................... 332/11 D X
4,305,050 12/1981 DeFreitas ...................... 332/11 D Primary Examiner—Siegfried H. Grimm
Assistant Examiner—Edward P. Westin
Attorney, Agent, or Firm—Lockwood D. Burton; Mitchell J. Halista

[57] ABSTRACT

A delta modulation circuit features a variable input voltage which is compared periodically with a quantized previous signal sample, resulting in a digitized output. The digitized output of the comparison controls the selective operation of a switching control circuit which, in turn, is clocked at a predetermined rate. The switching control circuit selectively applies a positive or a negative reference signal to the input of the quantizer from a common voltage reference source. A quantum charge is derived from the signal reference source then, through selective switching, that quantized charge is transferred in a positive or a negative direction to the input of a quantized charge memory device, resulting in the quantized last signal sample.

10 Claims, 2 Drawing Figures

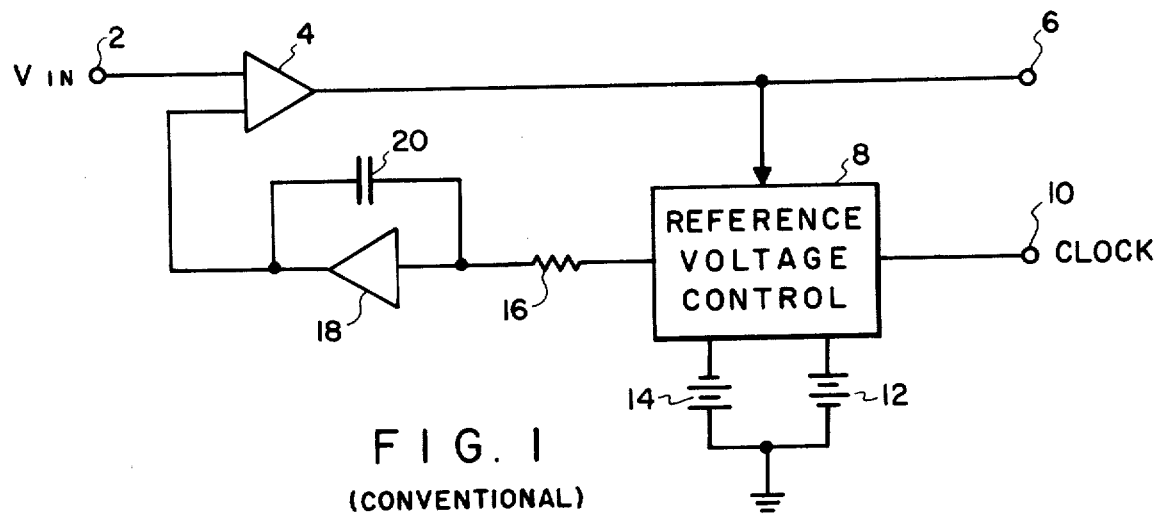
FIG. 1
(CONVENTIONAL)

HIGH ACCURACY DELTA MODULATOR

BACKGROUND OF THE INVENTION

The present invention relates to medical instrumentation apparatus, more particularly it relates to an improved delta modulation circuit for use in such medical instrumentation apparatus.

In the art of medical instrumentation, wherein sensing electrodes are attached to the patient to monitor certain body phenomena, it has been found necessary to provide a measure of isolation between the patient and the measuring, recording, and/or display apparatus, to prevent an inadvertent shock to or electrocution of the patient in the event of a malfunction of the measuring, recording, or display apparatus. In one form, that isolation circuitry has involved the use of a delta modulator to provide signal conversion.

In the conventional delta modulator, a variable voltage signal is compared with a quantized previous signal sample at a predetermined sampling rate. This produces a digitized output signal representative of the difference between the magnitude of the variable input signal and the previous sample. In such conventional delta modulators, a positive or a negative voltage reference signal is applied, depending upon the comparison of the previous signal with the present signal. The reference signal is applied through the sampling period to an integrator circuit to provide the quantized last signal sample. While such delta modulators have been used in systems in the past, the conventional delta modulator system as described includes a number of disadvantages which tend to limit the accuracy of such a system. One such deficiency is a voltage and current offset characteristic of the integrator. Such offset tends to produce an incorrect magnitude of the quantized reference signal. Second a separate reference voltage source is used for the positive and negative voltages. There is frequently a difference in the magnitude of the positive and negative reference voltage sources and this difference is also reflected in an incorrect value to the quantized reference signal. Because the signal is quantized by an integrator, the quantized signal is a time-dependent function. Accordingly, an additional deficiency is experienced in the presence of irregularities in the clocking signal. A further limitation which can result in an error is due to the finite time required to change the polarity of the quantized reference signal. Sine the quantizer is an integration circuit, a finite integrating time is of necessity a limiting factor on the sampling rate. When the input variable signal changes at a rate faster than the sampling rate, an inaccuracy in the resulting signal follows.

SUMMARY OF THE INVENTION

It is, accordingly, an object of the present invention to provide an improved delta modulator which avoids the foregoing deficiencies.

It is another object of the present invention to provide an improved coupling system for medical instrumentation apparatus.

In accomplishing these and other objectives, there has been provided in accordance with the present invention an improved delta modulation circuit wherein a variable input voltage is compared with a quantized previous signal sample, resulting in a digitized output. The digitized output of the comparison controls the selective operation of a switching control circuit which, in turn, is clocked at a predetermined rate. The switching control circuit selectively applies a positive or a negative reference signal to the input of the quantizer from a common reference signal source. A quantum charge is derived from the signal reference source then, through selective switching, that quantized charge is transferred in a positive or a negative direction to the input of a quantized charge memory device.

BRIEF DESCRIPTION OF THE DRAWINGS

A better understanding of the present invention may be had from the following detailed description when read in the light of the accompanying drawings in which:

FIG. 1 is a schematic block diagram of a previously known delta modulator.

DETAILED DESCRIPTION

Figure 2:
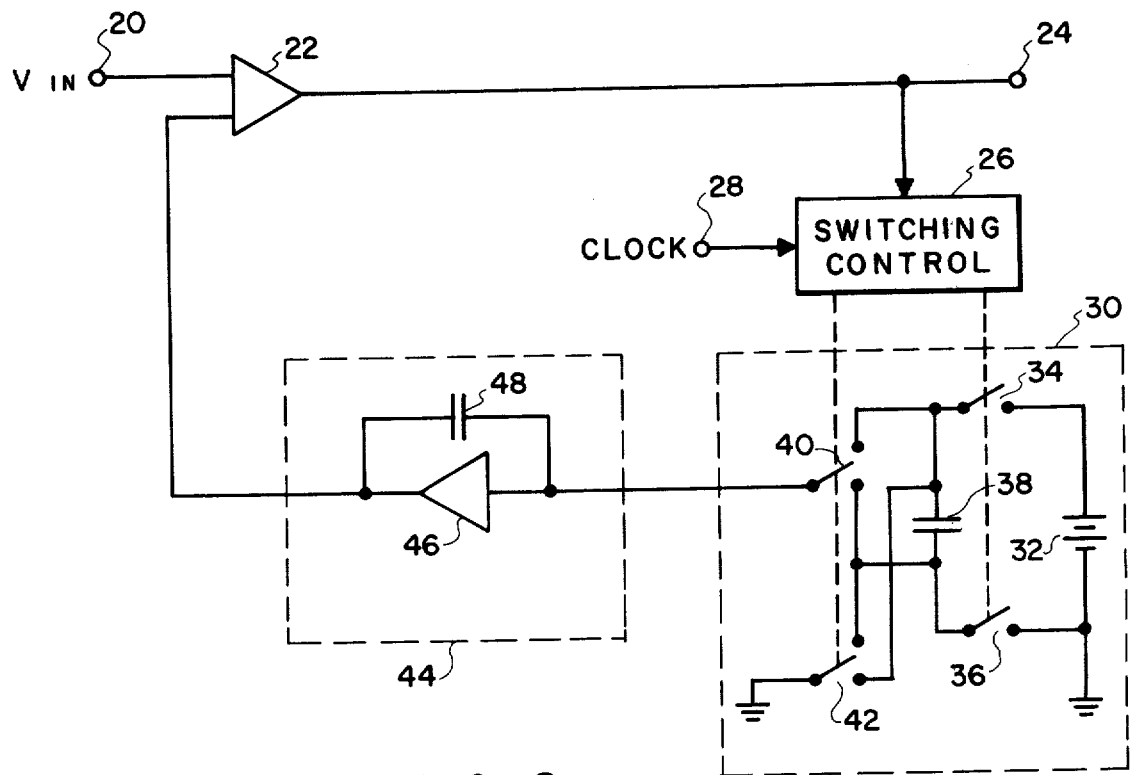
FIG. 2 is a schematic block diagram of a delta modulator in accordance with the present invention.

Referring now to the drawings in more detail, there is shown, in FIG. 1, a conventional delta modulator circuit wherein an input voltage signal is applied to an input terminal 2 connected to one input of a comparator 4. A quantized previous signal sample is applied to the second input terminal of the comparator 4. The output of the comparator 4 is a logical "high" or a logical "low" depending upon the relative magnitudes of the two input signals. That output signal from the comparator 4 is connected to an output terminal 6, the output signal for the loop. The output signal for the comparator 4 is also applied as control signal for a plus or minus reference voltage control unit 8.

The reference voltage control unit 8 comprises a switching logic which is activated by a clock signal applied to an input terminal 10. The clock signal applied to the input terminal 10 determines the frequency at which reference voltages are sampled. A positive reference voltage source is represented by a battery 12 while the negative reference voltage source is represented by a battery 14. These batteries 12 and 14 are connected, respectively, between ground and corresponding input terminals to the control unit 8. The output of the control unit 8 is connected to the input of an integration circuit which includes an integrator resistor 16, an amplifier 18, and a feedback capacitor 20. The output of the integrator circuits comprises a quantized previous signal sample which is applied to the second input terminal of comparator 4. In the modulator illustrated in FIG. 1, the output of the comparator 4 as noted, is a logical "high" or a logical "low" resulting from each successive comparison. The logical state of the output of the comparator 4, when applied to the input of the reference voltage control unit 8, determines whether the positive reference voltage 12 or the negative reference voltage 14 is to be applied to the input of the integrator. The clock signal applied to the input terminal 10 determines the sampling period for whichever of the two reference voltages are to be applied to the integrator. The timed integration of the reference signal by the integrator provides a quantized output signal representing the last sample, which is, in turn, an input terminal of the comparator 4.

Since the clock signal determines the sampling period for the integrator, it may be seen that the size of the quantum signal is a function of the size of the reference voltage and the period of the clock signal. If there is an irregularity in the period of the clock signal a corresponding variation will appear in the quantized last signal sample. Similarly if there is a disparity in the actual value between the positive and negative reference voltage sources, there will be a corresponding disparity in the magnitude of the positive and negative quantized reference signals. Either of these disparities will produce a corresponding error or irregularity in the digitized output signal applied to the terminal 6. Again, since the quantized signal sample is the result of a time-integral function, there are errors introduced as a result of the finite time required to change the polarity of the reference voltage signal.

The foregoing weaknesses of the conventional delta modulators shown in FIG. 1 are overcome by the improved delta modulator circuit shown in FIG. 2. In FIG. 2 the variable input signal is applied to an input terminal 20 connected to one input of a comparator 22. In an exemplary structure constructed in accordance with the present invention, it was found that an integrated circuit unit identified as LM311 produced by National Semiconductor is suitable for use as the comparator 22. A second input to the comparator 22 has a quantized previous signal sample applied thereto, as will be shown hereinafter. The output of the comparator 22 is connected to an output terminal 24 and to the input of a switching control logic unit 26. The switching control logic unit 26 is keyed by a clock signal of predetermined frequency connected to the clock input terminal 28. While the frequency of the clock signal may be of any frequency suitable to the application, in an exemplary structure constructed in accordance with the present invention, the clock signal had a frequency of 32 KH$_z$. The switching control logic unit 26 is connected to control the selective operation of a reference voltage switching network 30.

The reference voltage switching network 30 includes a DC reference voltage source represented by a battery 32. The battery 32 has the positive terminal thereof connected to a fixed contact of a first switch member 34, while the negative contact of the battery 32 is connected to ground and to a fixed contact of a second switch member 36. The switches 34 and 36 are effectively ganged together for simultaneous operation under the control of the switching control logic unit 26. These switches are represented as mechanical single-pole, single throw switches. It will be recognized, however, that in a preferred embodiment, the switches 34 and 36 are, in fact, solid state switches. The movable contact of the switch 34 is connected to a first side of a capacitor 38 while the other side of the capacitor is connected to the movable contact of the switch member 36. The first side of the capacitor 38 is connected to a first fixed contact of a third switch 40 and to a first fixed contact of a fourth switch 42. The second side of the capacitor 38 is connected to a second fixed contact of the switch 40 and to a second fixed contact of the switch member 42. The movable contact of the switch member 42 is connected to ground. The movable contact of the switch member 40 is connected to the input of a memory unit 44. The switch members 40 and 42 are represented in the drawings as mechanical single-pole, double-throw switches while in a preferred embodiment these switch members are also solid state switching devices.

The memory unit 44 includes an operational amplifier 46 and a memory capacitor 48. The memory capacitor 48 is connected directly across the operational amplifier 46, being connected between the input and the output terminals thereof. In a exemplary structure constructed in accordance with the present invention, an integrated circuit unit identified as LF356, produced by National Semiconductor, has been found to be suitable for use as the operational amplifier 46. The output terminal of the memory unit 44 is connected to the second input terminal of the comparator 22.

The comparator 22 in the circuit shown in FIG. 2 operates in substantially the same manner as the comparator in the conventional delta modulator shown in FIG. 1. That is, a variable input voltage is compared with a quantized previous signal sample on a periodic basis to produce a digitized output signal at the output terminal 24. The digitized output signal from the comparator 22 is also applied to an input terminal of the switching control logic unit 26. As noted before, the switching control logic unit 26 controls the actuation of the several switches in the reference voltage switching network 30. A relatively high frequency clock signal, applied to the input terminal 28 of the switching control logic unit 26, controls the timing of the actuation of the several switches in the network 30. At the beginning of each clock cycle applied to the switching control logic unit 26, the switches 34 and 36 are closed for a predetermined timed interval. That time interval is sufficient to allow the capacitor 38 to be charged substantially to the voltage of the reference voltage source 32. Under the control of the unit 26, the switches 34 and 36 are then opened. The switches 40 and 42 are both in a normally opened condition with respect to both sets of fixed contacts. Again under the control of the switching control logic unit 26, the switches 40 and 42 are selectively closed on one or the other of the two corresponding fixed contacts. The direction of the closure of the two switches 40 and 42 is determined by the nature of the signal applied during that clock cycle from the output of the comparator 22. The closure of the switches 40 and 42 causes the charge on the capacitor 38 to be algebraically summed with the charge on the capacitor 48 in the memory unit 44. The memory unit is an inverting stage, therefore a positive charge input will result in an output voltage shift in the negative direction and vice-versa. If the digital output of the comparator indicates that the input signal applied to the input terminal 20 is lower than the previous signal sample applied to the other input terminal of the comparator 22, the signal applied to the input of a switching control unit 26 will cause the switches 40 and 42 to be closed to their upper contacts, respectively.

The closure of those switches to their respective upper contacts causes the charge on the capacitor 38 to be added to the charge on the capacitor 48 in a positive direction. This, in turn, causes the output of the memory unit 44 to shift by one quantum of voltage step in the negative direction. If, on the other hand, the output of the comparator 22 is such as to indicate that the input signal is larger than the previous signal sample, the switching control logic unit 26 would cause the switches 40 and 42 to be closed on their respective lower fixed contacts. That arrangement causes the charge on the capacitor 38 to be applied to the input of the memory unit in an inverse or negative direction, thereby subtracting that charge from the charge on the capacitor 48 this causes the output of the memory unit 44 to shift by one quantum voltage step in the positive direction.

The charge increments, whether positive or negative, are derived from the same reference voltage source, using the same quantum capacitor 38. This arrangement eliminates the potential for differences between the positive and negative reference increments such as may occur in the conventional delta modulator circuits such as is seen in FIG. 1. With this quantum charge being established on a common capacitor and being derived from the common reference voltage source, there can be no difference in magnitude between the positive and negative increments. Thus one potential source of inaccuracies in the output signal, as distinguished from the conventional delta modulator, has been eliminated by the structure of the present invention.

The charge time of the capacitor 38 from the battery 32 is extremely short. Similarly the time required to transfer the charge on the capacitor 38 to the the capacitor 48 is also very small. So long as these charge times are small relative to the period determined by the clock cycles, the magnitude of the charge increments are independent of a time function. Instead, the magnitude of the charge increments is a function of the voltage of the reference source 32 and the ratio of the capacitors 38 and 48. In the exemplary embodiment constructed in accordance with the present invention, the voltage reference source 32 provided a five volt reference signal, the ratio of the capacitances of the capacitors 48 and 38 was scaled such that there was produced a quantum differential in the reference signal of 20 millivolts per clock cycle. It will be appreciated of course that the magnitude of the increments can be made of any desired value by suitably scaling the parameters of the circuit and the size of the reference voltage source signal. Since the quantized reference signal increments are independent of a time function, the time related errors mentioned in connection with the conventional delta modulator circuit are effectively eliminated.

While the present invention has been described in terms of discrete components, it will be appreciated that the structure of the apparatus is such as may be embodied in an integrated circuit chip module.

Thus there has been provided in accordance with the present invention, an improved delta modulator which features a high accuracy of output and in which time related or polarity related inaccuracies are eliminated.

The embodiments of the invention in which an exclusive property or privilege is claimed are defined as follows:

1. In a delta modulator having a comparator with a first and a second input terminal and an output terminal, an input signal applied to said first input terminal being compared with a quantized reference signal applied to said second input terminal to provide a digitized output signal on said output terminal, means for producing said quantized reference signal comprising:
   a reference voltage source means;
   a charge storage means selectively connected to said reference voltage source means to periodically charge said storage means;
   a memory means;
   means for periodically connecting said memory means to said charge storage means selectively in an additive or subtractive mode to algebraically sum the charge on said charge storage means with a charge on said memory means to provide said quantized reference signal at an output of said memory means;
   control means connected between said output terminal of said comparator means and said charge storage means and said means for periodically connecting for operating said charge storage means and said means for periodically connecting in response to said digitized output signal; and
   means connecting said output of said memory means to said second input terminal of said comparator.

2. A delta modulator comprising:
   a comparator having a first and a second input terminal and an output terminal, an input signal applied to said first input terminal being compared with a quantized reference signal applied to said second input terminal to provide a digitized output signal at said output terminal;
   means for producing said quantized reference signal including,
   a reference voltage source means,
   a charge storage means,
   means for selectively connecting said charge storage means to said reference voltage source means to periodically charge said storage means;
   a memory means;
   means for periodically connecting said memory means to said charge storage means selectively in an additive or subtractive mode to algebraically sum the charge on said charge storage means with a charge on said memory means to provide said quantized reference signal at an output of said memory means;
   switching control means for operating said means for selectively connecting and said means for periodically connecting in response to said output signal on said output terminal; and
   means connecting said output of said memory means to said second input terminal of said comparator.

3. A delta modulator as set forth in claim 2 wherein said charge storage means comprises a first capacitor.

4. A delta modulator as set forth in claim 3 wherein said means for selectively connecting said first capacitor to said reference voltage source means includes first switch means, periodically operated by said control means in accordance with a clock signal of predetermined frequency.

5. A delta modulator as set forth in claim 4 wherein said memory means includes an operational amplifier and a second capacitor, said second capacitor being connected between the output of said operational amplifier and the input thereof.

6. A delta modulator as set forth in claim 5 wherein said means for periodically connecting said memory means to said first capacitor comprises second switch means connected to be actuated by said control means in response to said clock signal and selectively in an additive or subtractive mode in response to the then prevailing output signal from said comparator.

7. A delta modulator as set forth in claim 3 wherein said switching control circuit is responsive to a clock signal of predetermined frequency to provide a first switching control signal during the first half of each cycle of said clock signal,
   said means for connecting said first capacitor to said reference voltage source means including a first switching means responsive to said first switching control signal to connect said capacitor across said reference voltage source means for a predetermined interval during each first switching control signal period, said switching control circuit being responsive to said clock signal and the then prevailing condition of said output signal from said comparator to provide a second switching control signal during the second half of each cycle of said clock signal, said second switching control signal being polarized in accordance with the then prevailing condition of said output signal from said comparator, and said means for connecting said memory means to said first capacitor including second switching means responsive to said second switching control signal to connect said first capacitor to said memory means for a predetermined interval during each second switching control signal period, said second switching means being a normally open circuit and operable under the control of said polarized second switching control signal to connect said first capacitor to said memory means in said additive or subtractive mode.

8. In a delta modulator as set forth in claim 1 wherein said charge storage means comprises a first capacitor.

9. In a delta modulator as set forth in claim 8 wherein said charge storage means includes first switch means, periodically operated by said control means in accordance with a clock signal of predetermined frequency and said means for periodically connecting said memory means to said first capacitor comprises second switch means connected to be actuated by said control means in response to the then prevailing output signal on said output terminal.

10. In a delta modulator as set forth in claim 8 wherein said memory means includes an operational amplifier and a second capacitor, said second capacitor being connected between the output of said operational amplifier and the input thereof.

* * * * *